US012642027B2

(12) United States Patent
Sherpa et al.

(10) Patent No.: US 12,642,027 B2
(45) Date of Patent: May 26, 2026

(54) LINE EDGE ROUGHNESS (LER) IMPROVEMENT OF RESIST PATTERNS

(71) Applicant: Applied Materials, Inc., Santa Clara, CA (US)

(72) Inventors: Sonam Dorje Sherpa, San Ramon, CA (US); Alok Ranjan, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 428 days.

(21) Appl. No.: 18/376,053

(22) Filed: Oct. 3, 2023

(65) Prior Publication Data

US 2025/0112056 A1 Apr. 3, 2025

(51) Int. Cl.
 *H10P 50/28* (2026.01)
(52) U.S. Cl.
 CPC .................................. *H10P 50/283* (2026.01)
(58) Field of Classification Search
 None
 See application file for complete search history.

(56) References Cited

U.S. PATENT DOCUMENTS

2013/0217241 A1 8/2013 Underwood et al.
2014/0273491 A1 9/2014 Zhang et al.
(Continued)

FOREIGN PATENT DOCUMENTS

CN 109074004 B 6/2020
CN 109801839 B 5/2022
TW 201947635 A 12/2019
(Continued)

OTHER PUBLICATIONS

Taiwanese Application No. 113137275, Office Action mailed on Jul. 29, 2025, 10 pages (1 page of English Translation and 9 pages of original document).
(Continued)

*Primary Examiner* — Roberts P Culbert
(74) *Attorney, Agent, or Firm* — Kilpatrick Townsend & Stockton LLP

(57) ABSTRACT

Exemplary semiconductor processing methods may include a substrate housed in the processing region. A layer of silicon-containing material may be disposed on the substrate, a patterned resist material may be disposed on the layer of silicon-containing material, and a layer of carbon-containing material may be disposed on the patterned resist material and the layer of silicon-containing material. The methods may include providing a hydrogen-containing precursor, a nitrogen-containing precursor, or both to a processing region of a semiconductor processing chamber, forming plasma effluents of the hydrogen-containing precursor and/or the nitrogen-containing precursor, and contacting the substrate with the plasma effluents of the hydrogen-containing precursor and/or the nitrogen-containing precursor. The contacting may remove a portion of the layer of carbon-containing material. The methods may include providing a fluorine-containing precursor to the processing region, forming plasma effluents of the fluorine-containing precursor, and contacting the substrate with the plasma effluents of the fluorine-containing precursor.

20 Claims, 5 Drawing Sheets

(56) References Cited

U.S. PATENT DOCUMENTS

| | | | |
|---|---|---|---|
| 2024/0096641 A1* | 3/2024 | Zhou | H01J 37/32816 |
| 2025/0112056 A1* | 4/2025 | Sherpa | H10P 50/283 |

FOREIGN PATENT DOCUMENTS

| | | |
|---|---|---|
| TW | 202137297 A | 10/2021 |
| TW | 202335084 A | 9/2023 |
| WO | 2022241042 A1 | 11/2022 |

OTHER PUBLICATIONS

Application No. PCT/US2024/048556 , International Search Report and Written Opinion, Mailed on Jan. 6, 2025, 11 pages.

* cited by examiner

440

425

420

415

410

405

440

425

420

415

410

405

LINE EDGE ROUGHNESS (LER) IMPROVEMENT OF RESIST PATTERNS

TECHNICAL FIELD

The present technology relates to semiconductor processes and equipment. More specifically, the present technology relates to improving line edge roughness prior to etching operations.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially etches silicon oxide over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Exemplary semiconductor processing methods may include providing a carbon-containing precursor to a processing region of a semiconductor processing chamber. A substrate may be housed in the processing region. A layer of silicon-containing material may be disposed on the substrate. A patterned resist material may be disposed on the layer of silicon-containing material. The methods may include contacting the substrate with the carbon-containing precursor. The contacting may deposit a layer of carbon-containing material on the substrate. The methods may include providing a hydrogen-containing precursor, a nitrogen-containing precursor, or both to the processing region. The methods may include forming plasma effluents of the hydrogen-containing precursor and/or the nitrogen-containing precursor. The methods may include contacting the substrate with the plasma effluents of the hydrogen-containing precursor and/or the nitrogen-containing precursor. The contacting may etch a portion of the layer of carbon-containing material to expose a portion of the layer of silicon-containing material. The methods may include providing a fluorine-containing precursor to the processing region. The methods may include forming plasma effluents of the fluorine-containing precursor. The methods may include contacting the substrate with the plasma effluents of the fluorine-containing precursor. The contacting may etch a feature in the layer of silicon-containing material. A semiconductor processing chamber operating temperature may be maintained at less than or about 0° C.

In some embodiments, the layer of silicon-containing material may be or include a silicon-oxygen-and-nitrogen-containing material or a silicon anti-reflective coating (SiARC). The layer of carbon-containing material may be characterized by a thickness of less than or about 10 nm. The hydrogen-containing precursor may be or include diatomic hydrogen ($H_2$). The nitrogen-containing precursor may be or include diatomic nitrogen ($N_2$). The fluorine-containing precursor may be or include hydrogen fluoride (HF). The plasma effluents of the fluorine-containing precursor may be formed at a plasma power of less than or about 500 W. The methods may include applying a bias voltage while contacting the substrate with the plasma effluents of the fluorine-containing precursor. The bias voltage may be less than or about 1.2 kV. The layer of carbon-containing material may be characterized by a line edge roughness (LER) of less than or about 2 nm. A semiconductor processing chamber operating pressure may be less than or about 100 mTorr.

Some embodiments of the present technology may encompass semiconductor processing methods. The methods may include providing a hydrogen-containing precursor, a nitrogen-containing precursor, or both to a processing region of a semiconductor processing chamber. A substrate may be housed in the processing region. A layer of silicon-containing material may be disposed on the substrate. A patterned resist material may be disposed on the layer of silicon-containing material. A layer of carbon-containing material may be disposed on the patterned resist material and the layer of silicon-containing material. The methods may include forming plasma effluents of the hydrogen-containing precursor and/or the nitrogen-containing precursor. The methods may include contacting the substrate with the plasma effluents of the hydrogen-containing precursor and/or the nitrogen-containing precursor. The contacting may remove a portion of the layer of carbon-containing material to expose a portion of the layer of silicon-containing material. The methods may include providing a fluorine-containing precursor to the processing region. The methods may include forming plasma effluents of the fluorine-containing precursor. The methods may include contacting the substrate with the plasma effluents of the fluorine-containing precursor. The contacting may etch a feature in the layer of silicon-containing material. The layer of carbon-containing material may be characterized by a line edge roughness (LER) of less than or about 1.5 nm.

In some embodiments, the substrate may further include a layer of bottom anti-reflective coating (BARC) material disposed between the layer of silicon-containing material and the patterned resist material. The methods may include pulsing a plasma power while forming plasma effluents of the fluorine-containing precursor. The plasma power may be pulsed at a duty cycle of less than or about 90%. A semiconductor processing chamber operating temperature may be maintained at less than or about −40° C.

Some embodiments of the present technology may encompass semiconductor processing methods. The methods may include providing a carbon-containing precursor to a processing region of a semiconductor processing chamber. A substrate may be housed in the processing region. A layer of silicon-containing material may be disposed on the substrate. A layer of bottom anti-reflective coating (BARC)

material may be disposed on the layer of silicon-containing material. A patterned resist material may be disposed on the layer of BARC material.

Sidewalls of the patterned resist material may be characterized by a line edge roughness (LER) of greater than or about 2 nm. The methods may include contacting the substrate with the carbon-containing precursor. The contacting may deposit a layer of carbon-containing material on the substrate. The methods may include providing a hydrogen-containing precursor, a nitrogen-containing precursor, or both to the processing region. The methods may include forming plasma effluents of the hydrogen-containing precursor and/or the nitrogen-containing precursor. The methods may include contacting the substrate with the plasma effluents of the hydrogen-containing precursor and/or the nitrogen-containing precursor. The contacting may etch a portion of the layer of carbon-containing material to expose a portion of the layer of silicon-containing material. The methods may include providing a fluorine-containing precursor to the processing region. The fluorine-containing precursor may be or include hydrogen fluoride (HF). The methods may include forming plasma effluents of the fluorine-containing precursor. The methods may include contacting the substrate with the plasma effluents of the fluorine-containing precursor. The contacting may etch a feature in the layer of silicon-containing material. A semiconductor processing chamber operating temperature may be maintained at less than or about 0° C.

In some embodiments, the plasma effluents of the fluorine-containing precursor may be formed at a plasma power of less than or about 500 W. Contacting the substrate with the carbon-containing precursor may reduce the LER of the patterned resist material. Contacting the substrate with the plasma effluents of the fluorine-containing precursor may selectively etch the layer of silicon-containing material and the layer of BARC material relative to the patterned resist material.

Such technology may provide numerous benefits over conventional systems and techniques. For example, the processes may reduce line edge roughness (LER) of patterned resist materials. Additionally, the processes may allow for a highly selective etch that maintains LER during pattern transfer operations. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
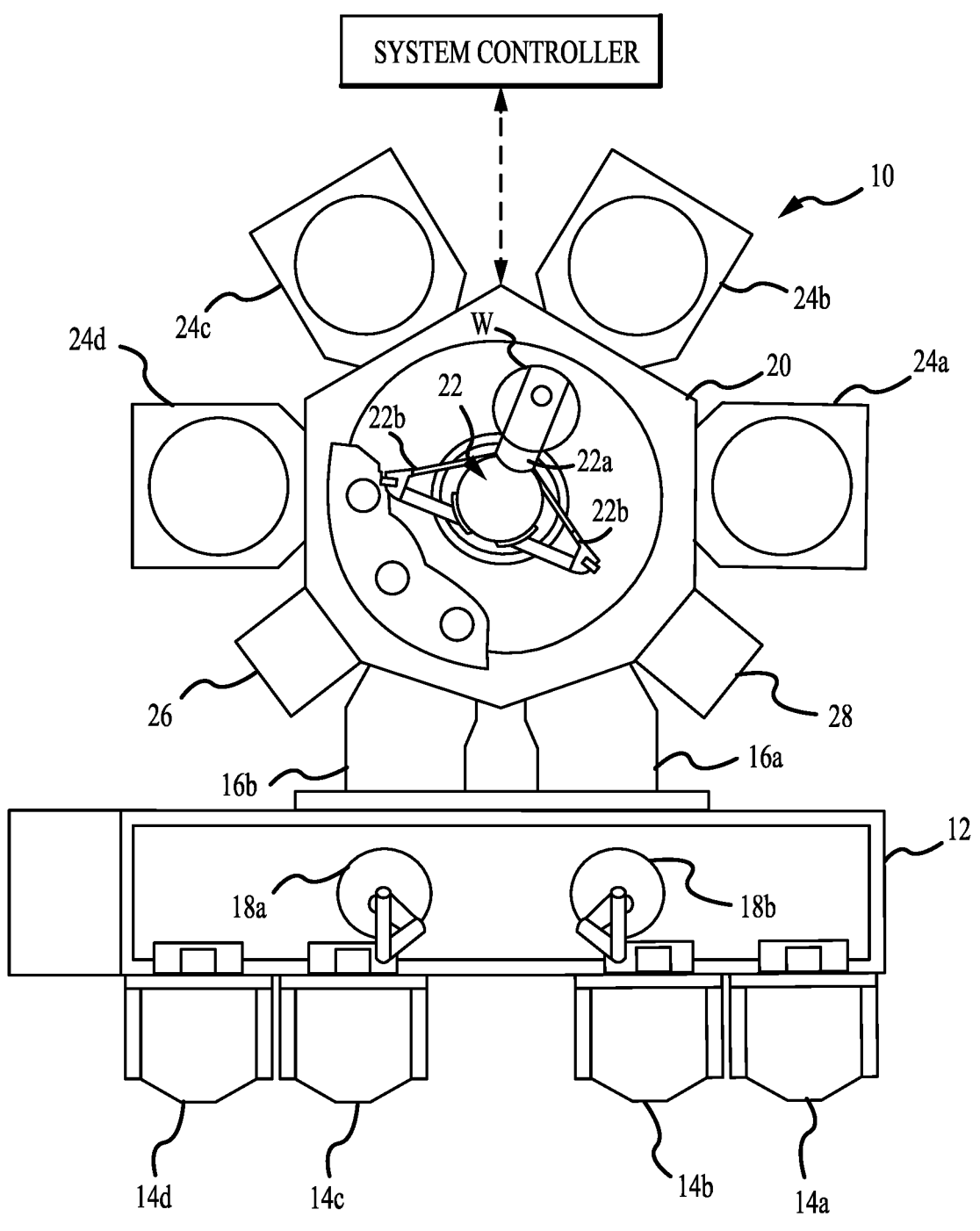
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include superfluous or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As structures evolve, the aspect ratios of features and other structures increase, sometimes dramatically. During pattern transfer operations, for example, features may be etched through one or more materials, such as a silicon-containing material. A patterned resist material, such as an extreme ultraviolet lithography (EUV) resist material, may be characterized by one or more openings to expose the underlying material, such as the silicon-containing material, that is to be etched selectively to the patterned resist material. However, as aspect ratios of the features and other structures increase, line edge roughness (LER) of the patterned resist material relative to the critical dimension of the features to be etched may increase. This relative increase in LER may be more noticeable as it propagates to the underlying materials during pattern transfer operations. To form high quality devices, it is desired that critical dimensions be uniform throughout the features being etched and that LER be minimized in such features.

Conventional technologies have not been able to address the LER issues associated with the patterned resist materials. Additionally, conventional technologies have struggled with selectivity between the material(s) to be etched and the patterned resist material. As such, the material(s) to be etched, such as the silicon-containing material, may be characterized by increased LER that may affect final device performance. Further, the reduced selectivity may etch the patterned resist materials.

The present technology overcomes these issues by depositing a carbon-containing material prior to etching the underlying material(s). The carbon-containing material, which may be deposited and etched to remain on sidewalls of the patterned resist materials, may be characterized by a reduced roughness compared to the patterned resist materials. The subsequent etch operations may be highly selective to the underlying material(s) relative to the carbon-containing material. Accordingly, the subsequent etch operations may transfer the pattern to the underlying material(s) with a reduced LER. The processing conditions, precursors, and operations of the present technology may afford pattern transfer to underlying materials with reduced roughness and/or increased selectivity compared to conventional technologies.

Although the remaining disclosure will routinely identify specific etching processes utilizing the disclosed technology, it will be readily understood that the systems and methods are equally applicable to etching processes as may occur in the described chambers. Accordingly, the technology should not be considered to be so limited as for use with etching processes or chambers alone. Moreover, although an exemplary chamber is described to provide foundation for the present technology, it is to be understood that the present technology can be applied to virtually any semiconductor processing chamber that may allow the single-chamber operations described. Similarly, although a specific etching operation will be described, it is to be understood that the processes may be equally applicable to other processes in which etching may be performed. Accordingly, the examples given should not be considered to limit the scope of the described technology.

FIG. 1 shows a top plan view of one embodiment of a processing system 10 of deposition, etching, baking, and/or curing chambers according to embodiments. The tool or processing system 10 depicted in FIG. 1 may contain a plurality of process chambers, 24a-d, a transfer chamber 20, a service chamber 26, an integrated metrology chamber 28, and a pair of load lock chambers 16a-b. The process chambers may include any number of structures or components, as well as any number or combination of processing chambers.

To transport substrates among the chambers, the transfer chamber 20 may contain a robotic transport mechanism 22. The transport mechanism 22 may have a pair of substrate transport blades 22a attached to the distal ends of extendible arms 22b, respectively. The blades 22a may be used for carrying individual substrates to and from the process chambers. In operation, one of the substrate transport blades such as blade 22a of the transport mechanism 22 may retrieve a substrate W from one of the load lock chambers such as chambers 16a-b and carry substrate W to a first stage of processing, for example, a treatment process as described below in chambers 24a-d. The chambers may be included to perform individual or combined operations of the described technology. For example, while one or more chambers may be configured to perform a deposition or etching operation, one or more other chambers may be configured to perform a pre-treatment operation and/or one or more post-treatment operations described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 22a and may insert a new substrate with a second blade. Once the substrate is processed, it may then be moved to a second stage of processing. For each move, the transport mechanism 22 generally may have one blade carrying a substrate and one blade empty to execute a substrate exchange. The transport mechanism 22 may wait at each chamber until an exchange can be accomplished.

Once processing is complete within the process chambers, the transport mechanism 22 may move the substrate W from the last process chamber and transport the substrate W to a cassette within the load lock chambers 16a-b. From the load lock chambers 16a-b, the substrate may move into a factory interface 12. The factory interface 12 generally may operate to transfer substrates between pod loaders 14a-d in an atmospheric pressure clean environment and the load lock chambers 16a-b. The clean environment in factory interface 12 may be generally provided through air filtration processes, such as HEPA filtration, for example. Factory interface 12 may also include a substrate orienter/aligner that may be used to properly align the substrates prior to processing. At least one substrate robot, such as robots 18a-b, may be positioned in factory interface 12 to transport substrates between various positions/locations within factory interface 12 and to other locations in communication therewith. Robots 18a-b may be configured to travel along a track system within factory interface 12 from a first end to a second end of the factory interface 12.

The processing system 10 may further include an integrated metrology chamber 28 to provide control signals, which may provide adaptive control over any of the processes being performed in the processing chambers. The integrated metrology chamber 28 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Each of processing chambers 24a-d may be configured to perform one or more process steps in the fabrication of a semiconductor structure, and any number of processing chambers and combinations of processing chambers may be used on multi-chamber processing system 10. For example, any of the processing chambers may be configured to perform a number of substrate processing operations including any number of deposition processes including cyclical layer deposition, atomic layer deposition, chemical vapor deposition, physical vapor deposition, as well as other operations including etch, pre-clean, pre-treatment, post-treatment, anneal, plasma processing, degas, orientation, and other substrate processes. Some specific processes that may be performed in any of the chambers or in any combination of chambers may be metal deposition, surface cleaning and preparation, thermal annealing such as rapid thermal processing, and plasma processing. Any other processes may similarly be performed in specific chambers incorporated into multi-chamber processing system 10, including any process described below, as would be readily appreciated by the skilled artisan.

Figure 2:
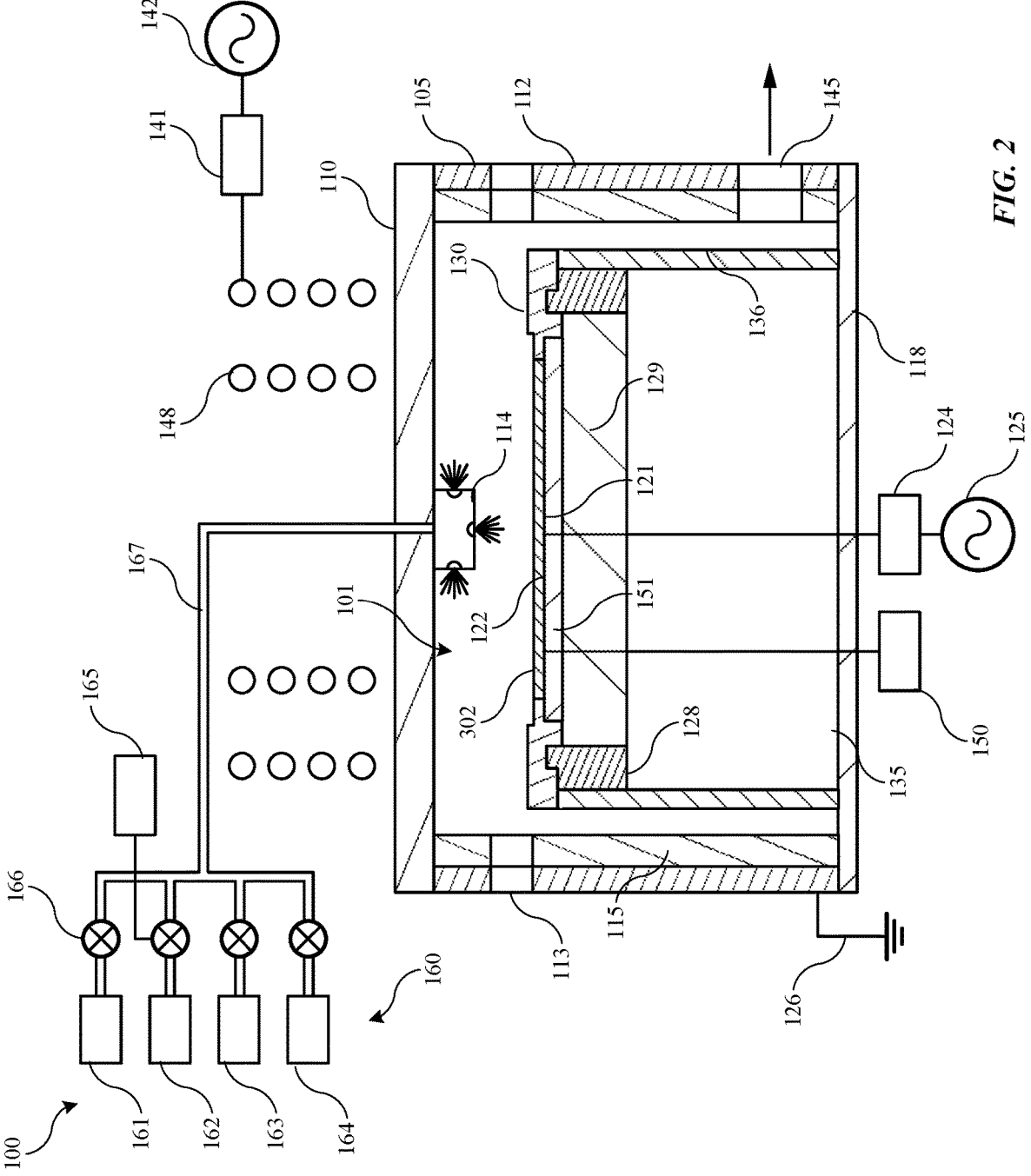
FIG. 2 shows a schematic cross-sectional view of an exemplary processing chamber according to some embodiments of the present technology.

FIG. 2 illustrates a schematic cross-sectional view of an exemplary processing chamber 100 suitable for patterning a material layer disposed on a substrate 302 in the processing chamber 100. The exemplary processing chamber 100 is suitable for performing a patterning process, although it is to be understood that aspects of the present technology may be performed in any number of chambers, and substrate supports according to the present technology may be included in etching chambers, deposition chambers, treatment chambers, or any other processing chamber. The plasma processing chamber 100 may include a chamber body 105 defining a chamber volume 101 in which a substrate may be processed. The chamber body 105 may have sidewalls 112 and a bottom 118 which are coupled with ground 126. The sidewalls 112 may have a liner 115 to protect the sidewalls 112 and extend the time between maintenance cycles of the plasma processing chamber 100. The dimensions of the chamber body 105 and related components of the plasma processing chamber 100 are not limited and generally may be proportionally larger than the size of the substrate 302 to be processed therein. Examples of substrate sizes include 200 mm diameter, 250 mm diameter, 300 mm diameter and 450 mm diameter, among others, such as display or solar cell substrates as well.

The chamber body 105 may support a chamber lid assembly 110 to enclose the chamber volume 101. The chamber body 105 may be fabricated from aluminum or other suitable materials. A substrate access port 113 may be formed through the sidewall 112 of the chamber body 105, facilitating the transfer of the substrate 302 into and out of the plasma processing chamber 100. The access port 113 may be coupled with a transfer chamber and/or other chambers of a substrate processing system as previously described. A pumping port 145 may be formed through the sidewall 112 of the chamber body 105 and connected to the chamber volume 101. A pumping device may be coupled through the pumping port 145 to the chamber volume 101 to evacuate and control the pressure within the processing volume. The pumping device may include one or more pumps and throttle valves.

A gas panel 160 may be coupled by a gas line 167 with the chamber body 105 to supply process gases into the chamber volume 101. The gas panel 160 may include one or more process gas sources 161, 162, 163, 164 and may additionally include inert gases, non-reactive gases, and reactive gases, as may be utilized for any number of processes. Examples of process gases that may be provided by the gas panel 160 include, but are not limited to, hydrocarbon containing gas including methane, sulfur hexafluoride, silicon chloride, carbon tetrafluoride, hydrogen bromide, hydrocarbon containing gas, argon gas, chlorine, nitrogen, helium, or oxygen gas, as well as any number of additional materials. Additionally, process gasses may include nitrogen, chlorine, fluorine, oxygen, and hydrogen containing gases such as $H_2$, $NH_3$, $H_2O$, $H_2O_2$, $NF_3$, $HF$, $F_2$, $CF_4$, $CHF_3$, $C_2F_6$, $C_2F_4$, $C_3F_6$, $C_4F_6$, $C_4F_8$, $BrF_3$, $ClF_3$, $SF_6$, $CH_3F$, $CH_2F_2$, $BCl_3$, $PF_3$, $PH_3$, $COS$, and $SO_2$, among any number of additional precursors.

Valves 166 may control the flow of the process gases from the sources 161, 162, 163, 164 from the gas panel 160 and may be managed by a controller 165. The flow of the gases supplied to the chamber body 105 from the gas panel 160 may include combinations of the gases form one or more sources. The lid assembly 110 may include a nozzle 114. The nozzle 114 may be one or more ports for introducing the process gases from the sources 161, 162, 164, 163 of the gas panel 160 into the chamber volume 101. After the process gases are introduced into the plasma processing chamber 100, the gases may be energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 302 and/or above the substrate 302 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 may be disposed in the chamber volume 101 to support the substrate 302 during processing. The substrate support pedestal 135 may include an electrostatic chuck ("ESC") 122 for holding the substrate 302 during processing. The electrostatic chuck 122 may use the electrostatic attraction to hold the substrate 302 to the substrate support pedestal 135. The ESC 122 may be powered by an RF power supply 125 integrated with a match circuit 124. The ESC 122 may include an electrode 121 embedded within a dielectric body. The electrode 121 may be coupled with the RF power supply 125 and may provide a bias which attracts plasma ions, formed by the process gases in the chamber volume 101, to the ESC 122 and substrate 302 seated on the pedestal. The RF power supply 125 may cycle on and off, or pulse, during processing of the substrate 302. The ESC 122 may have an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Electrode 121 may be coupled with a power source 150. The power source 150 may provide a chucking voltage of about 500 volts to about 15,000 volts to the electrode 121. The power source 150 may also include a system controller for controlling the operation of the electrode 121 by directing a DC current to the electrode 121 for chucking and de-chucking the substrate 302. For example, similar to the RF power supply 125, power supply 150 may provide a bias which attracts plasma ions, formed by the process gases in the chamber volume 101, to the ESC 122 and substrate 302 seated on the pedestal. The power supply 150 may cycle on and off, or pulse, during processing of the substrate 302. In embodiments, the power supply 150 may supply RF power, DC current or voltage for chucking and/or bias, or a combination thereof. In additional embodiments, multiple power supplies may be configured to supply RF power and DC current or voltage for chucking and/or bias. The ESC 122 may include heaters disposed within the pedestal and connected to a power source for heating the substrate, while a cooling base 129 supporting the ESC 122 may include conduits for circulating a heat transfer fluid to maintain a temperature of the ESC 122 and substrate 302 disposed thereon. The ESC 122 may be configured to perform in the temperature range required by the thermal budget of the device being fabricated on the substrate 302. For example, the ESC 122 may be configured to maintain the substrate 302 at a temperature of about −150° C. or lower to about 500° C. or higher depending on the process being performed.

The cooling base 129 may be provided to assist in controlling the temperature of the substrate 302. To mitigate process drift and time, the temperature of the substrate 302 may be maintained substantially constant by the cooling base 129 throughout the time the substrate 302 is in the cleaning chamber. In some embodiments, the temperature of the substrate 302 may be maintained throughout subsequent cleaning processes at temperatures between about −150° C. and about 500° C., although any temperatures may be utilized. A cover ring 130 may be disposed on the ESC 122 and along the periphery of the substrate support pedestal 135. The cover ring 130 may be configured to confine etching gases to a desired portion of the exposed top surface of the substrate 302, while shielding the top surface of the substrate support pedestal 135 from the plasma environment inside the plasma processing chamber 100. Lift pins may be selectively translated through the substrate support pedestal 135 to lift the substrate 302 above the substrate support pedestal 135 to facilitate access to the substrate 302 by a transfer robot or other suitable transfer mechanism as previously described.

The controller 165 may be utilized to control the process sequence, regulating the gas flows from the gas panel 160 into the plasma processing chamber 100, and other process parameters. Software routines, when executed by the CPU, transform the CPU into a specific purpose computer such as a controller, which may control the plasma processing chamber 100 such that the processes are performed in accordance with the present disclosure. The software routines may also be stored and/or executed by a second controller that may be associated with the plasma processing chamber 100.

Figure 3:
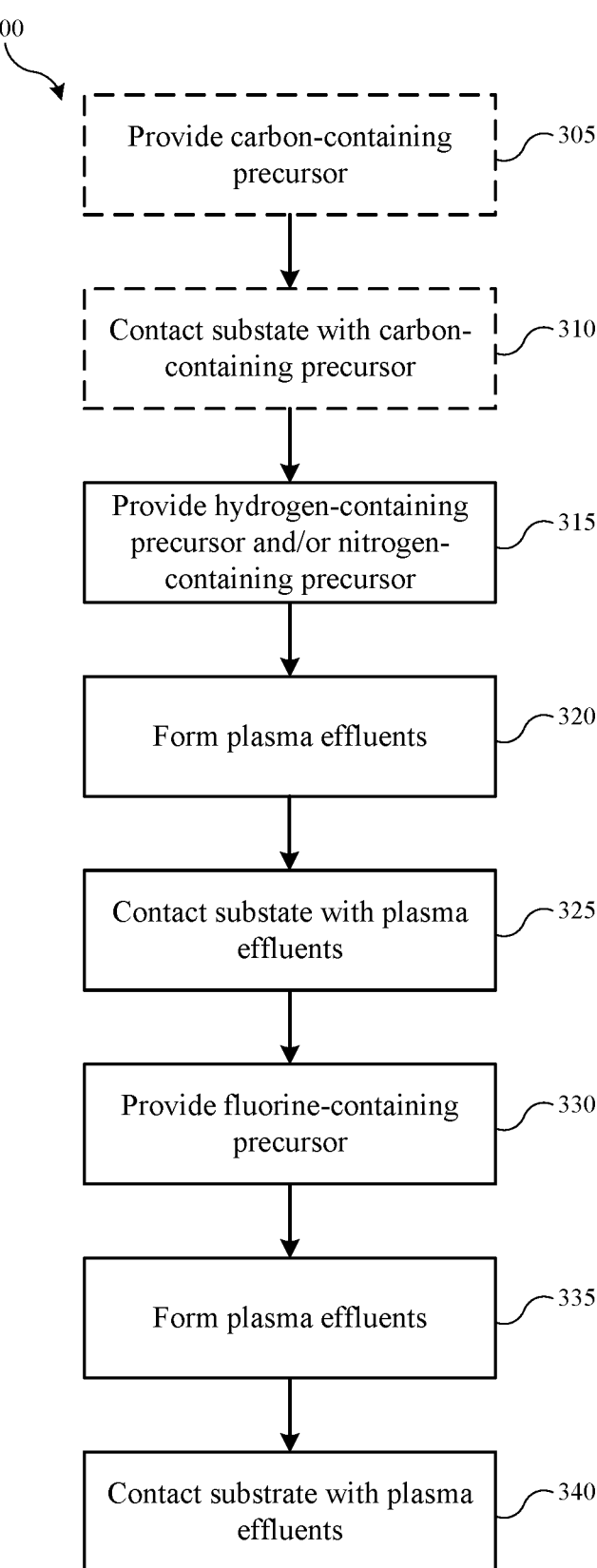
FIG. 3 shows selected operations in an etching method according to some embodiments of the present technology.

The chambers discussed previously may be used in performing exemplary methods including etching methods. Turning to FIG. 3 is shown exemplary operations in a method 300 according to embodiments of the present technology. Prior to the first operation of the method a substrate may be processed in one or more ways before being placed within a processing region of a chamber in which method 300 may be performed. For example, a carbon-containing material, such as amorphous carbon, may be formed on the substrate and then one or more patterns may be formed through a mask material. The mask material may include, but is not limited to, any number of mask materials. In embodiments, the mask material may include a plurality of materials to form a mask stack. For example, the plurality of materials may include one or more silicon-containing materials. In one exemplary embodiment, a silicon-oxygen-and-nitrogen-containing material may be formed on the carbon-containing material, a silicon-and-oxygen-containing material may be formed on the silicon-oxygen-and-nitrogen-containing material, and a silicon-containing material, such as amorphous silicon, may be formed on the silicon-and-oxygen-containing material. The one or more patterns may be formed through each layer of the mask material. Some or all of these operations may be performed in chambers or system tools as previously described, or may be performed in different chambers on the same system tool, which may include the chamber in which the operations of method 300 are performed.

Method 300 may include a number of optional operations, which may or may not be specifically associated with some embodiments of methods according to the present technology. For example, many of the operations are described in order to provide a broader scope of the structural formation, but are not critical to the technology, or may be performed by alternative methodology as will be discussed further below. Method 300 describes operations shown schematically in FIGS. 4A-4D, the illustrations of which will be described in conjunction with the operations of method 300. It is to be understood that FIGS. 4A-4D illustrate only partial schematic views, and a substrate may contain any number of structural sections having aspects as illustrated in the figures, as well as alternative structural aspects that may still benefit from operations of the present technology.

Figure 4A:
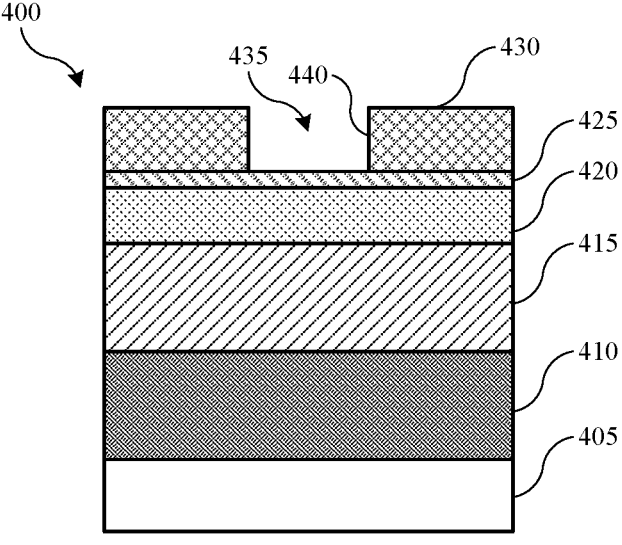
FIGS. 4A-4D illustrate cross-sectional views of substrate materials on which selected operations are being performed according to some embodiments of the present technology.

Method 300 may or may not involve optional operations to develop the semiconductor structure prior to a particular fabrication operation. It is to be understood that method 300 may be performed on any number of semiconductor structures, and FIG. 4A illustrates one exemplary memory structure within which a contact cleaning or etching process may be performed. As illustrated in FIG. 4A, a processed semiconductor structure 400 may include a substrate 405, which may have an underlying stack of material 410. In embodiments, the underlying stack of material 410 may be or include, for example, a carbon-containing material, an oxygen-containing material, a nitrogen-containing material, or alternating layers of materials, such as alternating layers of an oxygen-containing material and a nitrogen-containing material. A layer of carbon-containing material 415, such as amorphous carbon, may overly the underlying stack of material 410. A layer of silicon-containing material 420, such as a silicon-oxygen-and-nitrogen-containing material or a silicon anti-reflective coating (SiARC), may overly the layer of carbon-containing material 415. A layer of bottom anti-reflective coating (BARC) material 425 may overly the layer of silicon-containing material 420. Finally, a patterned resist material 430 may be disposed on the layer of silicon-containing material 420 or, if present, the layer of BARC material 425. The patterned resist material 430, such as an extreme ultraviolet lithography (EUV) resist material, may be patterned to define one or more openings 435 defined by sidewalls of the patterned resist material 430. The openings 435 may expose the underlying layer of silicon-containing material 420 or, if present, the layer of BARC material 425. It is to be understood that the noted structure is not intended to be limiting, and any of a variety of other semiconductor structures are similarly encompassed. Other exemplary structures may include two-dimensional and three-dimensional structures common in semiconductor manufacturing, and within which a pattern is to be transferred from a first material, such as patterned resist material 430, to one or more underlying materials, such as the layer of silicon-containing material 420 or, if present, the layer of BARC material 425. Additionally, although a high aspect ratio structure may benefit from the present technology, the technology may be equally applicable to lower aspect ratios and any other structures.

As shown in the figures, multiple materials may be present and exposed to etchant materials. The method 300 may be performed to etch or remove a portion of the layer of silicon-containing material 420 or, if present, the layer of BARC material 425 exposed within the opening 435 in the patterned resist material 430, while minimizing etching of other materials, such as the patterned resist material 430. By utilizing processing conditions, precursors, and operations according to embodiments of the present technology, etch rates of the layer of silicon-containing material 420 or, if present, the layer of BARC material 425 relative to the patterned resist material 430 may be increased. Additionally, profile control of the feature etched into the layer of silicon-containing material 420 or, if present, the layer of BARC material 425 may be more uniform compared to conventional technologies.

The patterning of the patterned resist material 430 to form openings 435 may leave rough edges of the sidewalls defining the openings. In embodiments, sidewalls of the patterned resist material 430 may be characterized by a line edge roughness (LER) of greater than or about 1.5 nm, and may be characterized by a LER of greater than or about 1.6 nm, greater than or about 1.7 nm, greater than or about 1.8 nm, greater than or about 1.9 nm, greater than or 2.0 nm, greater than or about 2.1 nm, greater than or about 2.2 nm, greater than or about 2.3 nm, greater than or about 2.4 nm, greater than or about 2.5 nm, greater than or about 2.6 nm, greater than or about 2.7 nm, greater than or about 2.8 nm, greater than or about 2.9 nm, greater than or about 3.0 nm, or more, although the LER may also be included in ranges between any two of these stated numbers or within any smaller range encompassed by any of the stated ranges. If left untreated, the high LER may be transferred to the underlying materials during pattern transfer operations. Accordingly, the present technology may perform operations to reduce the LER of the sidewalls of the patterned resist material 430.

Figure 4B:
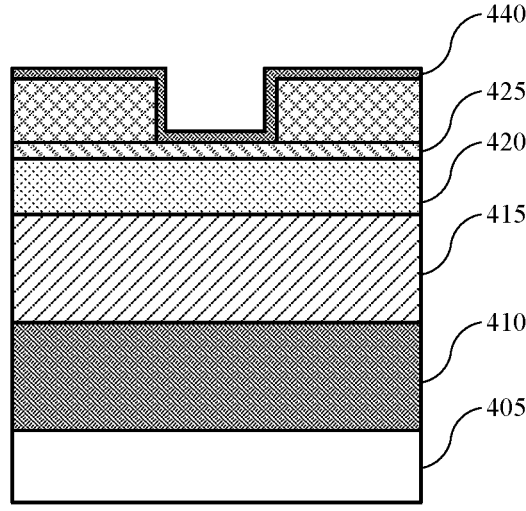

Method 300 may include providing a carbon-containing precursor to a processing region at optional operation 305. The processing region may house a substrate 405, such as processed semiconductor structure 400, which may have one or more layers of material previously discussed. The carbon-containing precursor may be any carbon-containing material useful in molecular layer deposition (MLD), atomic layer deposition (ALD), or chemical vapor deposition (CVD) of carbon-containing material. In embodiments, one or more inert gases or carrier gases may be provided with the carbon-containing precursor. For example, the carbon-containing precursor may be provided with any number of carrier gases, which may include argon (Ar), helium (He), nitrogen, or other noble, inert, or useful precursors. The carrier gases may be used to dilute the carbon-containing precursor, which may reduce deposition rates and/or allow adequate diffusion through the openings 435 in the patterned resist material 430. In embodiments, plasma effluents may be formed, such as within the processing region of the semiconductor processing chamber. The plasma effluents may include plasma effluents of any of the precursors previously discussed. At optional operation 310, method 300 may include contacting the substrate 405 with the carbon-containing precursor or plasma effluents thereof. As illustrated in FIG. 4B, the contacting may deposit the layer of carbon-containing material 440 on the substrate 405. The layer of carbon-containing material 440 may conformally form on the substrate 405. As illustrated, the layer of carbon-containing material 440 may overly the patterned resist material 430 and may extend into the openings 435 to also overly the layer of silicon-containing material 420 or, if present, the layer of BARC material 425.

A thickness of the layer of carbon-containing material 440 may be thick enough to reduce the LER of the sidewalls of the patterned resist material 430. Simultaneously, the thickness of the layer of carbon-containing material 440 may be thin enough to not impart unnecessary material to the structure 400 and/or significantly reduce dimensions of the openings 435. In embodiments, the layer of carbon-containing material 440 may be characterized by a thickness of less than or about 10 nm, and 440 may be characterized by a thickness of less than or about 9 nm, less than or about 8 nm, less than or about 7 nm, less than or about 6 nm, less than or about 5 nm, less than or about 4 nm, less than or about 3 nm, less than or about 2 nm, or less, although the thickness may also be included in ranges between any two of these stated numbers or within any smaller range encompassed by any of the stated ranges.

The carbon-containing material 440 may be characterized by a reduced LER compared to the patterned resist material 430. For example, the carbon-containing material 440 may be characterized by a LER of less than or about 1.5 nm, and may be characterized by a LER of less than or about 1.4 nm, less than or about 1.3 nm, less than or about 1.2 nm, less than or about 1.1 nm, less than or 1.0 nm, or less, although the LER may also be included in ranges between any two of these stated numbers or within any smaller range encompassed by any of the stated ranges. The reduced LER may be maintained during pattern transfer as further discussed below.

Figure 4C:
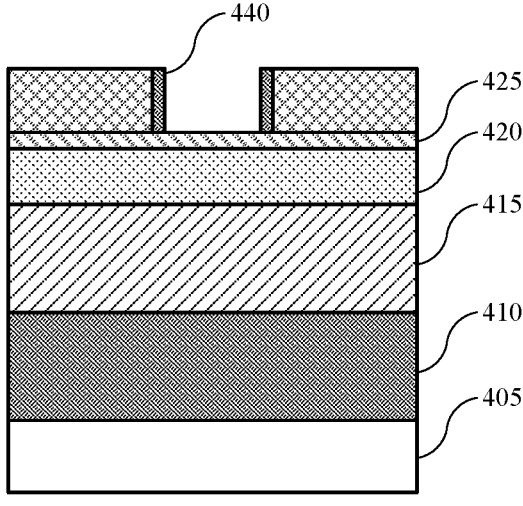

After forming the carbon-containing material 440 to a desired thickness to reduce the LER of sidewalls of the patterned resist material 430, a flow rate of the carbon-containing precursor may be halted. At operation 315, method 300 may include providing a hydrogen-containing precursor, a nitrogen-containing precursor, or both to the processing region. While any hydrogen-containing precursor and nitrogen-containing precursor useful in semiconductor processing may be used, an exemplary hydrogen-containing precursor may be diatomic hydrogen (H₂) and an exemplary nitrogen-containing precursor may be diatomic nitrogen (N₂). Similar to the carbon-containing precursor at optional operation 305, one or more inert gases or carrier gases may be provided with the hydrogen-containing precursor and/or the nitrogen-containing precursor. Plasma effluents of the hydrogen-containing precursor and/or the nitrogen-containing precursor may be formed at operation 320. At operation 325, method 300 may include contacting the substrate 405 with the plasma effluents of the hydrogen-containing precursor and/or the nitrogen-containing precursor. As illustrated in FIG. 4C, the contacting may etch a portion of the layer of carbon-containing material 440 to expose a portion of the layer of silicon-containing material 420 or, if present, the layer of BARC material 425. The portion of the layer of carbon-containing material 440 etched may be material normal to the flow of the hydrogen-containing precursor and/or the nitrogen-containing precursor or plasma effluents thereof. Accordingly, carbon-containing material 440 overlying the layer of silicon-containing material 420 or, if present, the layer of BARC material 425 may be removed to expose the underlying material.

Figure 4D:
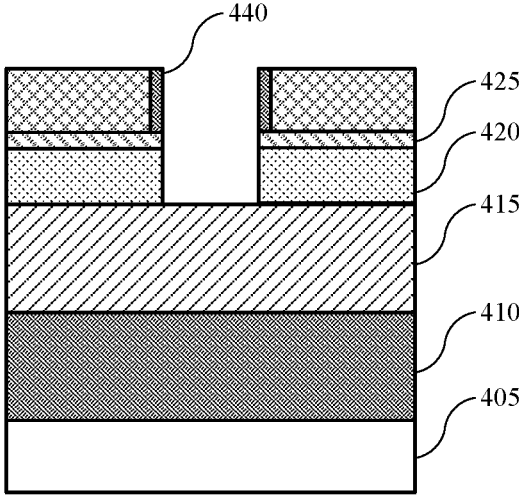

After removing the carbon-containing material 440 to expose the underlying layer of silicon-containing material 420 or, if present, the layer of BARC material 425, a flow rate of the hydrogen-containing precursor and/or nitrogen-containing precursor may be halted. At operation 330, method 300 may include providing a fluorine-containing precursor to the processing region. An exemplary fluorine-containing precursor may be hydrogen fluoride (HF). However, other sources of fluorine useful in semiconductor processing may be used, such as nitrogen trifluoride (NF₃), diatomic fluoride (F₂), or any other fluorine-containing material. Operation 335 may include forming plasma effluents of the fluorine-containing precursor. Method 300 may include contacting the substrate with the plasma effluents of the fluorine-containing precursor at operation 340. As illustrated in FIG. 4D, the contacting may etch a feature in the layer of silicon-containing material 420 and, if present, the layer of BARC material 425.

In embodiments, a flow rate of the fluorine-containing precursor may be adequate to control the residence time of the fluorine etchant species in the processing region. For example, the flow rate of the fluorine-containing precursor may be greater than or about 10 sccm, and may be greater than or about 20 sccm, greater than or about 30 sccm, greater than or about 40 sccm, greater than or about 50 sccm, greater than or about 75 sccm, greater than or about 100 sccm, greater than or about 150 sccm, greater than or about 200 sccm, greater than or about 250 sccm, greater than or about 275 sccm, greater than or about 300 sccm, or more, although the flow rate may also be included in ranges between any two of these stated numbers or within any smaller range encompassed by any of the stated ranges. However, to maintain precise control over the etching, the flow rate may also be maintained at less than or about 750 sccm, less than or about 700 sccm, less than or about 600 sccm, less than or about 500 sccm, less than or about 400 sccm, less than or about 300 sccm, or less, although the flow rate may also be included in ranges between any two of these stated numbers or within any smaller range encompassed by any of the stated ranges.

The plasma effluents formed from the fluorine-containing precursor may be formed locally in the processing region or in a remote plasma system. For example, the plasma effluents may be generated by a remote plasma source (RPS), a capacitively coupled plasma (CCP), or an inductively coupled plasma (ICP) with or without one or more carrier gases such as Ar, He, N₂, H₂, or mixtures thereof. The plasma effluents may be a low-level plasma to limit the amount of bombardment and resultant sputtering, potential for clogging of the openings 435, and/or bending/bowing during the etching. In embodiments the plasma power may be less than or about 1,000 W, and may be less than or about 900 W, less than or about 800 W, less than or about 700 W, less than or about 600 W, less than or about 500 W, less than or about 400 W, less than or about 300 W, less than or about 200 W, less than or about 100 W, or less, although the plasma power may also be included in ranges between any two of these stated numbers or within any smaller range encompassed by any of the stated ranges. By utilizing a low-level plasma power, the plasma effluents may be better controlled for delivery through the openings 435 of the patterned resist material 430, while limiting sputtering of the etching or sputtering of the patterned resist material 430 and/or the carbon-containing material 440 as well as other exposed surfaces.

While some embodiments may utilize a continuous wave plasma power, the plasma power may be pulsed in embodiments to lower the effective power. Lower plasma powers may increase etch rates of the silicon-containing material 420 while simultaneously reducing etch rates of the carbon-containing material 440. For example, an effective plasma power of less than or about 250 W may etch the silicon-containing material 420 and/or the BARC material 425 without etching the carbon-containing material 440. Accordingly, to lower the effective power, the plasma power may be pulsed at a duty cycle of less than or about 95%, and may be pulsed at a duty cycle of less than or about 90%, less than or about 89%, less than or about 88%, less than or about 87%, less than or about 86%, less than or about 85%, or less, although the duty cycle may also be included in ranges between any two of these stated numbers or within any smaller range encompassed by any of the stated ranges. Furthermore, the plasma power may be pulsed at a frequency of less than or about 10,000 Hz, less than or about 7,500 Hz, less than or about 5,000 Hz, less than or about 2,500 Hz, less than or about 2,000 Hz, less than or about 1,750 Hz, less than or about 1,500 Hz, less than or about 1,250 Hz, less than or about 1,000 Hz, or less, although the frequency may also be included in ranges between any two of these stated numbers or within any smaller range encompassed by any of the stated ranges.

Additionally, a bias voltage may be applied to the substrate 405. The bias voltage may provide directional flow of plasma effluents to the substrate 405. Thus, the plasma effluents may be directed into the openings 435, which may facilitate the plasma effluents to progress through the patterned resist material 430 and to the layer of silicon-containing material 420 or, if present, the layer of BARC material 425. In embodiments, the bias voltage may be less than or about 2.0 kV, and may be less than or about 1.8 kV, less than or about 1.6 kV, less than or about 1.5 kV, less than or about 1.4 kV, less than or about 1.3 kV, less than or about 1.2 kV, less than or about 1.1 kV, less than or about 1.0 kV, or less, although the bias voltage may also be included in ranges between any two of these stated numbers or within any smaller range encompassed by any of the stated ranges. By applying a bias voltage, narrow ion angle distribution may result and provide better profile control (e.g., without bending and/or twisting) and verticality of the etching. The narrow ion angle distribution may reduce sidewall attack, increase the etch rate, and make the etch front more square. However, at higher bias voltages, such as greater than 2.0 kV, selectivity may decrease due to the increased bombardment and resultant sputtering of the patterned resist material 430 and/or the carbon-containing material 440.

In embodiments, the bias voltage may be applied via an RF power supply, such as RF power supply 125, and/or a power supply used for directing DC current or voltage to the ESC, such as power supply 150. As previously discussed with regard to FIG. 2, the RF power supply and/or the power supply used for directing DC current or voltage may cycle on and off, or pulse, during processing. By pulsing, ion energy and ion flux may be better controlled and lower angular spread of the plasma effluents may be achieved. The lower ion energy may result in less sputtering of the sidewall of the openings 435. In embodiments, the source power and the bias voltage may be synchronized or non-synchronized.

Process conditions may also impact the operations performed in method 300. Each of the operations of method 300 may be performed during a constant temperature in embodiments, while in some embodiments the temperature may be adjusted during different operations. For example, a semiconductor processing chamber operating temperature, which may include the substrate, pedestal, or chamber temperature, during the method 300 may be maintained at a temperature less than or about 0° C., and in some embodiments the temperature may be maintained less than or about −10° C., less than or about −20° C., less than or about −30° C., less than or about −40° C., less than or about −50° C., less than or about −60° C., less than or about −70° C., less than or about −80° C., less than or about −90° C., less than or about −100° C., less than or about −110° C., less than or about −120° C., or less, although the temperature may also be included in ranges between any two of these stated numbers or within any smaller range encompassed by any of the stated ranges. For example, the semiconductor processing chamber operating temperature may be between about −100° C. about −20° C., or between any other values previously stated.

The pressure within the processing chamber may be controlled during method 300. For example, while forming the plasma effluents and performing the etching operation, the semiconductor processing chamber operating pressure may be maintained below at less than or about 100 mTorr, and may be maintained at less than or about 90 mTorr, less than or about 80 mTorr, less than or about 70 mTorr, less than or about 60 mTorr, less than or about 50 mTorr, less than or about 45 mTorr, less than or about 40 mTorr, less than or about 35 mTorr, less than or about 30 mTorr, less than or about 25 mTorr, less than or about 20 mTorr, less than or about 18 mTorr, less than or about 16 mTorr, less than or about 14 mTorr, below or about 12 mTorr, less than or about 10 mTorr, or less, although the pressure may also be included in ranges between any two of these stated numbers or within any smaller range encompassed by any of the stated ranges. The pressure within the processing chamber may affect the capabilities of flow into the opening 435. For example, as pressure increases, plasma effluents may have increased difficulty in permeating the opening 435 and reaching the underlying material to be etched.

By forming the carbon-containing material 440, the LER of the patterned resist material 430 may be reduced due to the decreased roughness of the carbon-containing material 440. Further, by the processing conditions, precursors, and operations according to embodiments of the present technology may result in the layer of silicon-containing material 420 and/or, if present, the layer of BARC material 425 being removed selectively to the carbon-containing material 440. Therefore, the reduced LER provided by the carbon-containing material 440 may result in a reduced LER in e layer of silicon-containing material 420 and/or, if present, the layer of BARC material 425 during etching and pattern transfer operations.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
providing a carbon-containing precursor to a processing region of a semiconductor processing chamber, wherein a substrate is housed in the processing region, wherein a layer of silicon-containing material is disposed on the substrate, and wherein a patterned resist material is disposed on the layer of silicon-containing material;
contacting the substrate with the carbon-containing precursor, wherein the contacting deposits a layer of carbon-containing material on the substrate;
providing a hydrogen-containing precursor, a nitrogen-containing precursor, or both to the processing region;
forming plasma effluents of the hydrogen-containing precursor and/or the nitrogen-containing precursor;
contacting the substrate with the plasma effluents of the hydrogen-containing precursor and/or the nitrogen-containing precursor, wherein the contacting etches a portion of the layer of carbon-containing material to expose a portion of the layer of silicon-containing material;
providing a fluorine-containing precursor to the processing region;
forming plasma effluents of the fluorine-containing precursor; and
contacting the substrate with the plasma effluents of the fluorine-containing precursor, wherein the contacting etches a feature in the layer of silicon-containing material, and wherein a semiconductor processing chamber operating temperature is maintained at less than or about 0° C.

2. The semiconductor processing method of claim 1, where the layer of silicon-containing material comprises a silicon-oxygen-and-nitrogen-containing material or a silicon anti-reflective coating (SiARC).

3. The semiconductor processing method of claim 1, wherein the layer of carbon-containing material is characterized by a thickness of less than or about 10 nm.

4. The semiconductor processing method of claim 1, wherein the hydrogen-containing precursor comprises diatomic hydrogen ($H_2$).

5. The semiconductor processing method of claim 1, wherein the nitrogen-containing precursor comprises diatomic nitrogen ($N_2$).

6. The semiconductor processing method of claim 1, wherein the fluorine-containing precursor comprises hydrogen fluoride (HF).

7. The semiconductor processing method of claim 1, wherein the plasma effluents of the fluorine-containing precursor are formed at a plasma power of less than or about 500 W.

8. The semiconductor processing method of claim 1, further comprising:
applying a bias voltage while contacting the substrate with the plasma effluents of the fluorine-containing precursor.

9. The semiconductor processing method of claim 8, wherein the bias voltage is less than or about 1.2 kV.

10. The semiconductor processing method of claim 1, wherein the layer of carbon-containing material is characterized by a line edge roughness (LER) of less than or about 2 nm.

11. The semiconductor processing method of claim 1, wherein a semiconductor processing chamber operating pressure is less than or about 100 mTorr.

12. A semiconductor processing method comprising:
providing a hydrogen-containing precursor, a nitrogen-containing precursor, or both to a processing region of a semiconductor processing chamber, wherein a substrate is housed in the processing region, wherein a layer of silicon-containing material is disposed on the substrate, wherein a patterned resist material is disposed on the layer of silicon-containing material, and wherein a layer of carbon-containing material is disposed on the patterned resist material and the layer of silicon-containing material;
forming plasma effluents of the hydrogen-containing precursor and/or the nitrogen-containing precursor;
contacting the substrate with the plasma effluents of the hydrogen-containing precursor and/or the nitrogen-containing precursor, wherein the contacting etches a portion of the layer of carbon-containing material to expose a portion of the layer of silicon-containing material;

providing a fluorine-containing precursor to the processing region;

forming plasma effluents of the fluorine-containing precursor; and contacting the substrate with the plasma effluents of the fluorine-containing precursor, wherein the contacting etches a feature in the layer of silicon-containing material, and wherein the layer of carbon-containing material is characterized by a line edge roughness (LER) of less than or about 1.5 nm.

13. The semiconductor processing method of claim 12, wherein the substrate further comprises a layer of bottom anti-reflective coating (BARC) material disposed between the layer of silicon-containing material and the patterned resist material.

14. The semiconductor processing method of claim 12, further comprising:

pulsing a plasma power while forming plasma effluents of the fluorine-containing precursor.

15. The semiconductor processing method of claim 14, wherein the plasma power is pulsed at a duty cycle of less than or about 90%.

16. The semiconductor processing method of claim 12, wherein a semiconductor processing chamber operating temperature is maintained at less than or about-40° C.

17. A semiconductor processing method comprising:

providing a carbon-containing precursor to a processing region of a semiconductor processing chamber, wherein a substrate is housed in the processing region, wherein a layer of silicon-containing material is disposed on the substrate, wherein a layer of bottom anti-reflective coating (BARC) material is disposed on the layer of silicon-containing material, wherein a patterned resist material is disposed on the layer of BARC material, and wherein sidewalls of the patterned resist material are characterized by a line edge roughness (LER) of greater than or about 2 nm;

contacting the substrate with the carbon-containing precursor, wherein the contacting deposits a layer of carbon-containing material on the substrate;

providing a hydrogen-containing precursor, a nitrogen-containing precursor, or both to the processing region;

forming plasma effluents of the hydrogen-containing precursor and/or the nitrogen-containing precursor;

contacting the substrate with the plasma effluents of the hydrogen-containing precursor and/or the nitrogen-containing precursor, wherein the contacting etches a portion of the layer of carbon-containing material to expose a portion of the layer of silicon-containing material;

providing a fluorine-containing precursor to the processing region, wherein the fluorine-containing precursor comprises hydrogen fluoride (HF);

forming plasma effluents of the fluorine-containing precursor; and contacting the substrate with the plasma effluents of the fluorine-containing precursor, wherein the contacting etches a feature in the layer of silicon-containing material, and wherein a semiconductor processing chamber operating temperature is maintained at less than or about 0° C.

18. The semiconductor processing method of claim 17, wherein the plasma effluents of the fluorine-containing precursor are formed at a plasma power of less than or about 500 W.

19. The semiconductor processing method of claim 17, wherein contacting the substrate with the carbon-containing precursor reduces the LER of the patterned resist material.

20. The semiconductor processing method of claim 17, wherein contacting the substrate with the plasma effluents of the fluorine-containing precursor selectively etches the layer of silicon-containing material and the layer of BARC material relative to the patterned resist material.

* * * * *